(12) United States Patent
Lin et al.

(10) Patent No.: US 9,793,187 B2
(45) Date of Patent: Oct. 17, 2017

(54) 3D PACKAGES AND METHODS FOR FORMING THE SAME

(71) Applicant: Taiwan Semiconductor Manufacturing Company, Ltd., Hsin-Chu (TW)

(72) Inventors: Shih Ting Lin, Taipei (TW); Kung-Chen Yeh, Taichung (TW); Szu-Wei Lu, Hsin-Chu (TW); Jing-Cheng Lin, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/827,842

(22) Filed: Aug. 17, 2015

(65) Prior Publication Data
US 2015/0357255 A1    Dec. 10, 2015

Related U.S. Application Data

(62) Division of application No. 14/015,703, filed on Aug. 30, 2013, now Pat. No. 9,111,912.
(Continued)

(51) Int. Cl.
*H01L 23/18* (2006.01)
*H01L 23/00* (2006.01)
(Continued)

(52) U.S. Cl.
CPC .......... *H01L 23/18* (2013.01); *H01L 21/4803* (2013.01); *H01L 21/56* (2013.01); *H01L 21/6835* (2013.01); *H01L 21/6836* (2013.01); *H01L 23/055* (2013.01); *H01L 23/12* (2013.01); *H01L 23/28* (2013.01); *H01L 23/31* (2013.01);
(Continued)

(58) Field of Classification Search
CPC ......... H01L 23/12; H01L 23/16; H01L 23/18; H01L 23/24; H01L 23/28; H01L 23/31; H01L 23/3128; H01L 23/3135; H01L 23/34; H01L 23/42; H01L 23/4334
See application file for complete search history.

(56) References Cited

U.S. PATENT DOCUMENTS 5,990,546 A * 11/1999 Igarashi .............. H01L 23/3121
  257/700
6,081,037 A *  6/2000 Lee ........................ H01L 23/13
  257/706
(Continued)

FOREIGN PATENT DOCUMENTS

CN          1302455 A      7/2001

*Primary Examiner* — Eduardo A Rodela
(74) *Attorney, Agent, or Firm* — Slater Matsil, LLP

(57) ABSTRACT

Embodiments of the present disclosure include a semiconductor device and methods of forming a semiconductor device. An embodiment is a method of forming a semiconductor device, the method including bonding a die to a top surface of a first substrate, the die being electrically coupled to the first substrate, and forming a support structure on the top surface of the first substrate, the support structure being physically separated from the die with a top surface of the support structure being coplanar with a top surface of the die. The method further includes performing a sawing process on the first substrate, the sawing process sawing through the support structure.

20 Claims, 13 Drawing Sheets

Related U.S. Application Data

(60) Provisional application No. 61/829,158, filed on May 30, 2013.

(51) Int. Cl.

| | | |
|---|---|---|
| *H01L 21/56* | (2006.01) | |
| *H01L 21/48* | (2006.01) | |
| *H01L 23/28* | (2006.01) | |
| *H01L 23/31* | (2006.01) | |
| *H01L 23/12* | (2006.01) | |
| *H01L 23/055* | (2006.01) | |
| *H01L 23/367* | (2006.01) | |
| *H01L 25/065* | (2006.01) | |
| *H01L 21/683* | (2006.01) | |
| *H01L 23/48* | (2006.01) | |
| *H01L 23/498* | (2006.01) | |

(52) U.S. Cl.
CPC ...... *H01L 23/3135* (2013.01); *H01L 23/3675* (2013.01); *H01L 23/3677* (2013.01); *H01L 24/80* (2013.01); *H01L 24/92* (2013.01); *H01L 24/94* (2013.01); *H01L 24/97* (2013.01); *H01L 25/0657* (2013.01); *H01L 21/561* (2013.01); *H01L 23/3128* (2013.01); *H01L 23/481* (2013.01); *H01L 23/49827* (2013.01); *H01L 24/03* (2013.01); *H01L 24/05* (2013.01); *H01L 24/06* (2013.01); *H01L 24/11* (2013.01); *H01L 24/13* (2013.01); *H01L 24/16* (2013.01); *H01L 24/17* (2013.01); *H01L 24/32* (2013.01); *H01L 24/81* (2013.01); *H01L 24/83* (2013.01); *H01L 2221/68327* (2013.01); *H01L 2221/68331* (2013.01); *H01L 2221/68368* (2013.01); *H01L 2224/0345* (2013.01); *H01L 2224/03452* (2013.01); *H01L 2224/03462* (2013.01); *H01L 2224/0401* (2013.01); *H01L 2224/05144* (2013.01); *H01L 2224/05147* (2013.01); *H01L 2224/05155* (2013.01); *H01L 2224/05166* (2013.01); *H01L 2224/05171* (2013.01); *H01L 2224/05624* (2013.01); *H01L 2224/05639* (2013.01); *H01L 2224/05644* (2013.01); *H01L 2224/05647* (2013.01); *H01L 2224/05684* (2013.01); *H01L 2224/06181* (2013.01); *H01L 2224/1132* (2013.01); *H01L 2224/1144* (2013.01); *H01L 2224/1145* (2013.01); *H01L 2224/1146* (2013.01); *H01L 2224/11334* (2013.01); *H01L 2224/11424* (2013.01); *H01L 2224/11452* (2013.01); *H01L 2224/11462* (2013.01); *H01L 2224/11464* (2013.01); *H01L 2224/11849* (2013.01); *H01L 2224/131* (2013.01); *H01L 2224/13082* (2013.01); *H01L 2224/13083* (2013.01); *H01L 2224/13084* (2013.01); *H01L 2224/13109* (2013.01); *H01L 2224/13111* (2013.01); *H01L 2224/13124* (2013.01); *H01L 2224/13139* (2013.01); *H01L 2224/13144* (2013.01); *H01L 2224/13147* (2013.01); *H01L 2224/13155* (2013.01); *H01L 2224/13164* (2013.01); *H01L 2224/16145* (2013.01); *H01L 2224/16225* (2013.01); *H01L 2224/16227* (2013.01); *H01L 2224/17181* (2013.01); *H01L 2224/32145* (2013.01); *H01L 2224/32225* (2013.01); *H01L 2224/32245* (2013.01); *H01L 2224/73204* (2013.01); *H01L 2224/73253* (2013.01); *H01L 2224/814* (2013.01); *H01L 2224/81005* (2013.01); *H01L 2224/81191* (2013.01); *H01L 2224/81411* (2013.01); *H01L 2224/81439* (2013.01); *H01L 2224/81815* (2013.01); *H01L 2224/81895* (2013.01); *H01L 2224/8385* (2013.01); *H01L 2224/83104* (2013.01); *H01L 2224/92* (2013.01); *H01L 2224/9202* (2013.01); *H01L 2224/94* (2013.01); *H01L 2224/97* (2013.01); *H01L 2225/06513* (2013.01); *H01L 2225/06517* (2013.01); *H01L 2225/06568* (2013.01); *H01L 2225/06589* (2013.01); *H01L 2924/15311* (2013.01); *H01L 2924/181* (2013.01)

(56) References Cited

U.S. PATENT DOCUMENTS

| | | | |
|---|---|---|---|
| 6,140,707 A | 10/2000 | Plepys et al. | |
| 6,362,522 B1* | 3/2002 | Ley | H01L 23/36 257/711 |
| 6,459,152 B1* | 10/2002 | Tomita | H01L 23/49822 174/535 |
| 6,794,273 B2* | 9/2004 | Saito | H01L 21/4857 257/618 |
| 7,339,264 B2 | 3/2008 | Shibata | |
| 2003/0016511 A1 | 1/2003 | Tomita et al. | |
| 2004/0150118 A1* | 8/2004 | Honda | H01L 21/563 257/778 |
| 2007/0224776 A1 | 9/2007 | Chiou | |
| 2009/0289352 A1* | 11/2009 | Horie | H01L 23/3675 257/712 |
| 2011/0031619 A1 | 2/2011 | Chen et al. | |

* cited by examiner

3D PACKAGES AND METHODS FOR FORMING THE SAME

PRIORITY CLAIM

This application is a divisional of U.S. patent application Ser. No. 14/015,703, filed on Aug. 30, 2013, entitled "3D Packages and Methods for Forming the Same," which claims priority to U.S. Provisional Application No. 61/829,158, filed on May 30, 2013, and entitled "3D Packages and Methods for Forming the Same," which applications are incorporated herein by reference.

BACKGROUND

Since the invention of the integrated circuit (IC), the semiconductor industry has experienced rapid growth due to continuous improvements in the integration density of various electronic components (i.e., transistors, diodes, resistors, capacitors, etc.). For the most part, this improvement in integration density has come from repeated reductions in minimum feature size, which allows more components to be integrated into a given area.

These integration improvements are essentially two-dimensional (2D) in nature, in that the volume occupied by the integrated components is essentially on the surface of the semiconductor wafer. Although dramatic improvement in lithography has resulted in considerable improvement in 2D IC formation, there are physical limits to the density that can be achieved in two dimensions. One of these limits is the minimum size needed to make these components. In addition, when more devices are put into one chip or die, more complex designs are required.

BRIEF DESCRIPTION OF THE DRAWINGS

For a more complete understanding of the present embodiments, and the advantages thereof, reference is now made to the following descriptions taken in conjunction with the accompanying drawings, in which.

DETAILED DESCRIPTION OF ILLUSTRATIVE EMBODIMENTS

Figure 1:
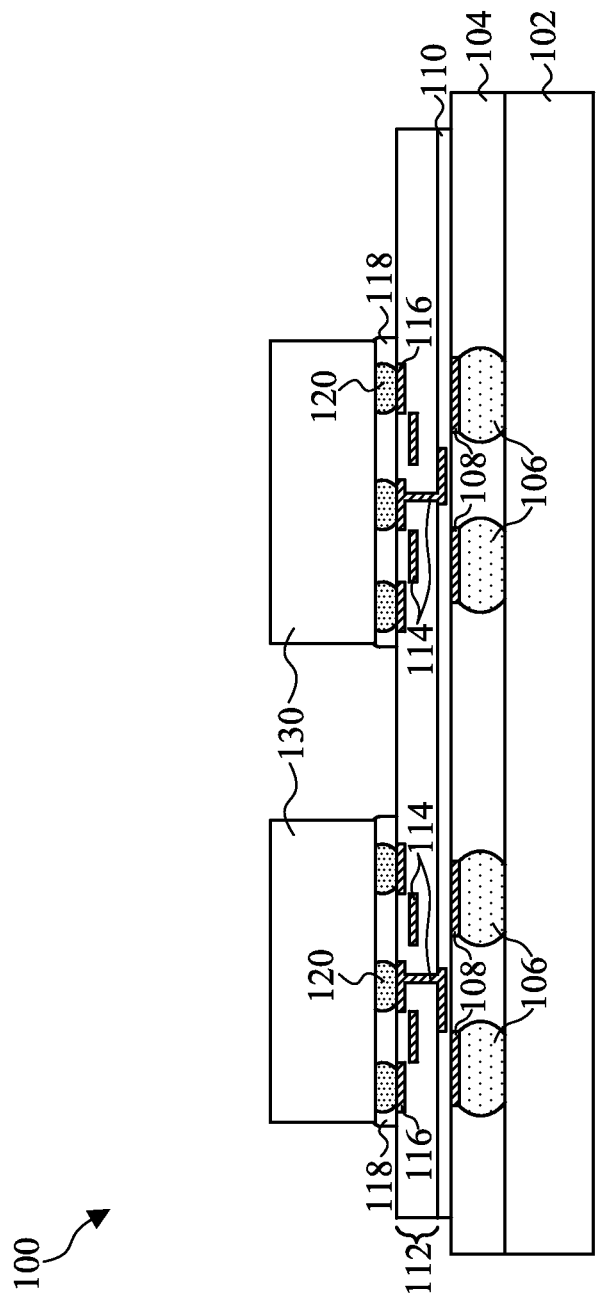
FIGS. 1 through 5 illustrate intermediate stages of forming a semiconductor device according to an embodiment.

Reference will now be made in detail to embodiments illustrated in the accompanying drawings. Wherever possible, the same reference numbers are used in the drawings and the description to refer to the same or like parts. In the drawings, the shape and thickness may be exaggerated for clarity and convenience. This description will be directed in particular to elements forming part of, or cooperating more directly with, methods and apparatus in accordance with the present disclosure. It is to be understood that elements not specifically shown or described may take various forms well known to those skilled in the art. Many alternatives and modifications will be apparent to those skilled in the art, once informed by the present disclosure.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration.

Embodiments will be described with respect to a specific context, namely a method of forming a semiconductor device with a thermally conductive support structure. Other embodiments may also be applied, however, to other package structure configurations.

Figure 4:
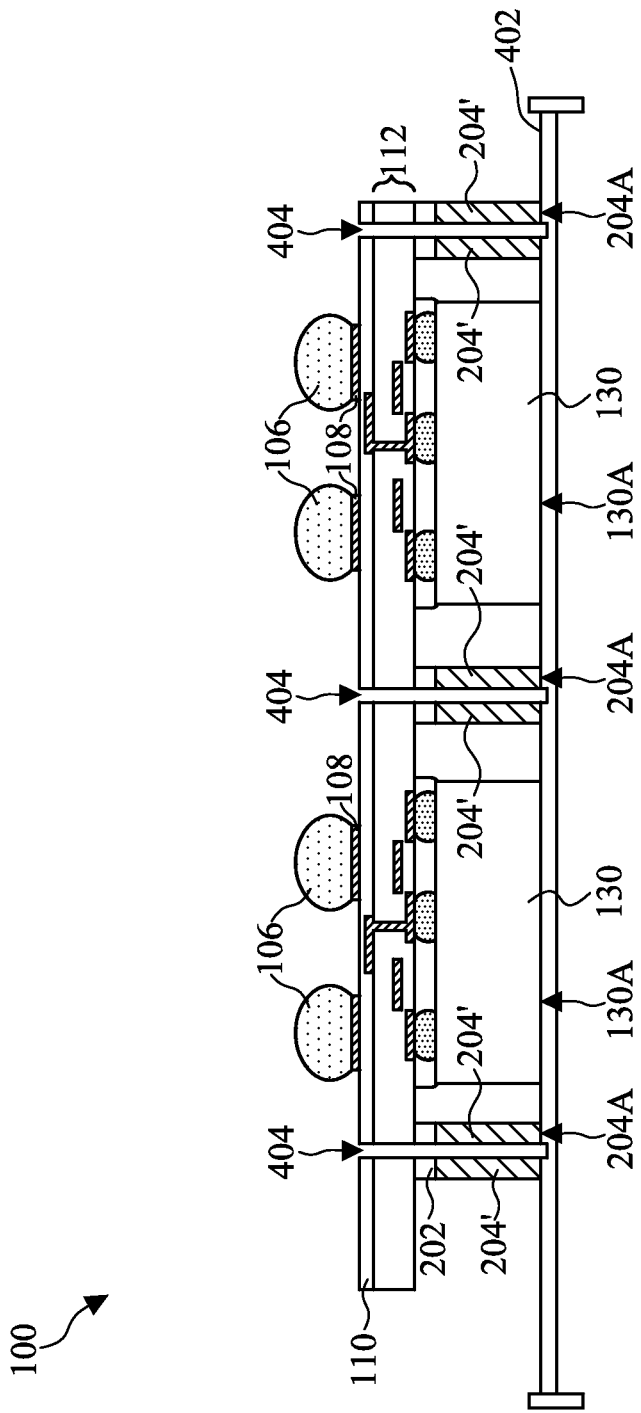
Figure 5:
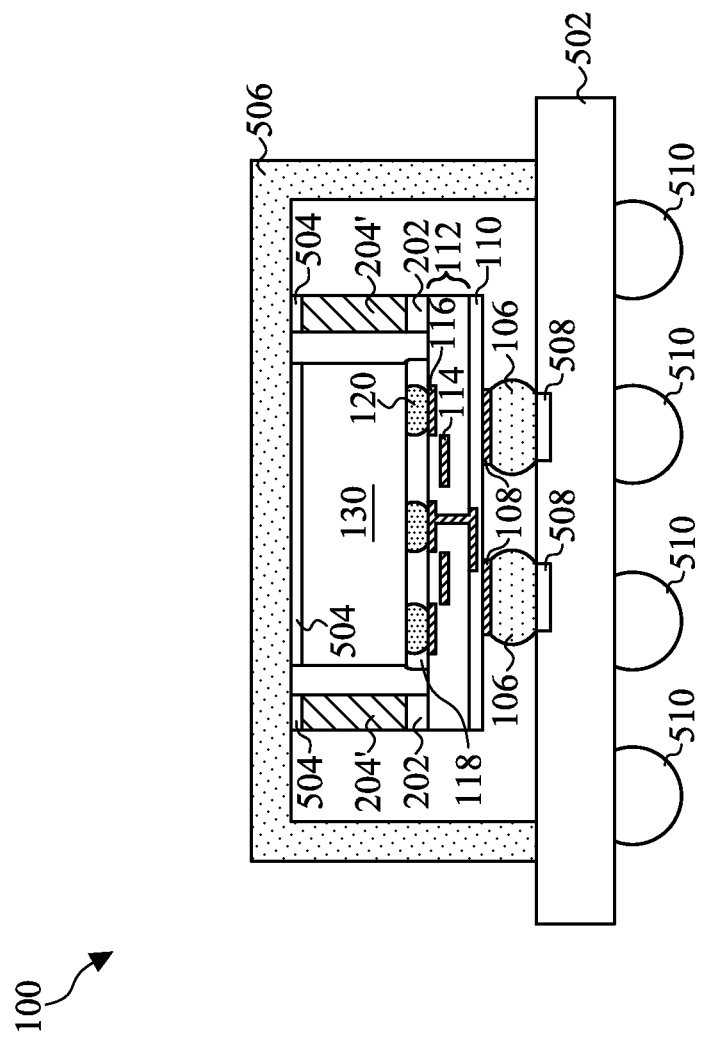
Figure 6:
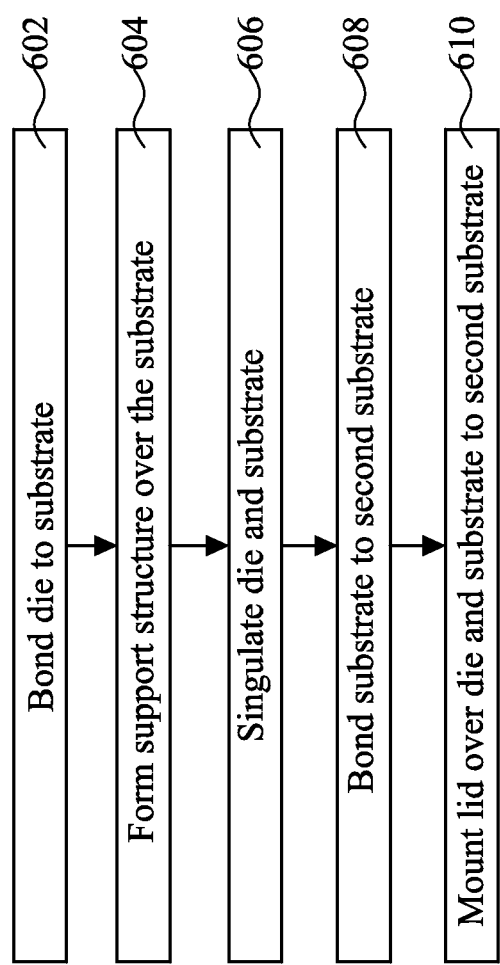
FIG. 6 illustrates a process flow of the process illustrated in FIGS. 1 through 5 according to an embodiment.
Figure 7:
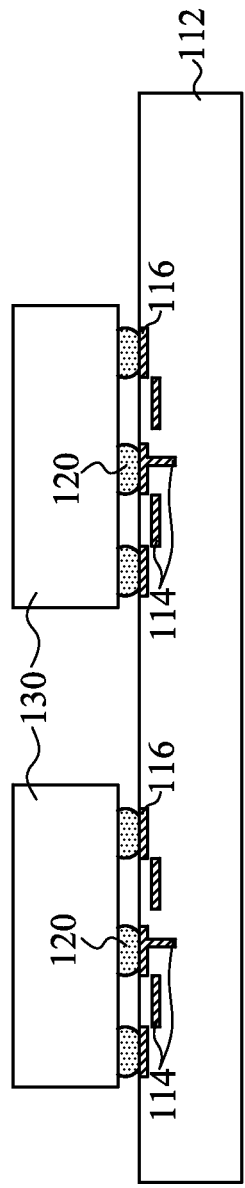
FIGS. 7 through 11 illustrate intermediate stages of forming a semiconductor device according to an embodiment.

FIGS. 1 through 5 are cross-sectional views of intermediate stages in the manufacturing of a semiconductor device according to an embodiment, and FIG. 6 is a process flow of the process shown in FIGS. 1 through 5.

FIG. 1 illustrates a semiconductor device 100 in an intermediate stage of manufacture. The semiconductor device 100 may include a carrier 102, an adhesive layer 104, connectors 106, bond pads 108, a passivation layer 110, a substrate 112 with metallization layers and vias 114, bond pads 116, connectors 120 in an underfill 118, and dies 130. The dies 130 may be bonded to the substrate 112 (step 602) by connectors 120. The substrate 112 may be made of a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the substrate 112 may be a silicon-on-insulator (SOI) substrate. Generally, an SOI substrate includes a layer of a semiconductor material such as epitaxial silicon, germanium, silicon germanium, SOI, silicon germanium on insulator (SGOI), or combinations thereof.

The substrate 112 may include active and passive devices (not shown in FIG. 1). As one of ordinary skill in the art will recognize, a wide variety of devices such as transistors, capacitors, resistors, combinations of these, and the like may be used to generate the structural and functional requirements of the design for the semiconductor device 100. The devices may be formed using any suitable methods.

The substrate 112 may also include metallization layers 114. The metallization layers may be formed over the active and passive devices and are designed to connect the various devices to form functional circuitry. The metallization layers may be formed of alternating layers of dielectric (e.g., low-k dielectric material) and conductive material (e.g., copper) with vias interconnecting the layers of conductive material and may be formed through any suitable process (such as deposition, damascene, dual damascene, or the like).

The bond pads 116 may be formed in a first side of the substrate 112. In some embodiments, the bond pads 116 are formed by forming recesses (not shown) into the substrate 112 or a passivation layer (not shown) on the substrate 112. The recesses may be formed to allow the bond pads 116 to be embedded into the substrate 112 or the passivation layer. In other embodiments, the recesses are omitted as the bond pads may be formed on a first side of the substrate 112. These bond pads 116 electrically couple the subsequently bonded dies 130 to be metallization layers 114 and/or the connectors 106 on a second side of the substrate 112. In some embodiments, the bond pads 116 include a thin seed layer (not shown) deposited on the substrate 112, such as by physical vapor deposition (PVD), chemical vapor deposition (CVD), atomic layer deposition (ALD), the like, or a combination thereof. The seed layer may be made of copper, titanium, nickel, gold, the like, or a combination thereof. The conductive material of the bond pads 116 may be deposited over the thin seed layer. The conductive material may be formed by an electro-chemical plating process, CVD, ALD, PVD, the like, or a combination thereof. In an embodiment, the conductive material of the bond pads 116 is copper, tungsten, aluminum, silver, gold, the like, or a combination thereof.

In an embodiment the bond pads 116 are UBMs 116 and include three layers of conductive materials, such as a layer of titanium, a layer of copper, and a layer of nickel. However, one of ordinary skill in the art will recognize that there are many suitable arrangements of materials and layers, such as an arrangement of chrome/chrome-copper alloy/copper/gold, an arrangement of titanium/titanium tungsten/copper, or an arrangement of copper/nickel/gold, that are suitable for the formation of the UBMs 116. Any suitable materials or layers of material that may be used for the UBMs 116 are fully intended to be included within the scope of the current application.

After the bond pads 116 are formed, an active surface of the dies 130, the active surface having the connectors 120, is bonded to a first side of the substrate 112 by way of the connectors 120 and the bond pads 116. The dies 130 may be device dies having integrated circuit devices, such as transistors, capacitors, inductors, resistors (not shown), and the like, therein. Further, the dies 130 may be logic dies having core circuits, and may be, for example, a central processing unit (CPU) die. In some embodiments, the dies 130 are multiple stacked dies like a memory stacking. The connectors 120 may be bonded to contacts or bond pads (not shown) on the dies 130.

The connectors 120 are illustrated as micro bumps in FIG. 1, however in other embodiments, the connectors 120 are solder balls, metal pillars, controlled collapse chip connection (C4) bumps, electroless nickel-electroless palladium-immersion gold technique (ENEPIG) formed bumps, or the like. The connectors 120 may include a conductive material such as solder, copper, aluminum, gold, nickel, silver, palladium, tin, the like, or a combination thereof. In an embodiment in which the connectors 120 are solder bumps, the connectors 120 are formed by initially forming a layer of solder through such commonly used methods such as evaporation, electroplating, printing, solder transfer, ball placement, or the like. Once a layer of solder has been formed on the structure, a reflow may be performed in order to shape the material into the desired bump shape. In another embodiment, the connectors 120 are metal pillars (such as a copper pillars) formed by a sputtering, printing, electro plating, electroless plating, CVD, or the like. The metal pillars may be solder free and have substantially vertical sidewalls. In some embodiments, a metal cap layer (not shown) is formed on the top of the metal pillar connectors 120. The metal cap layer may include nickel, tin, tin-lead, gold, silver, palladium, indium, nickel-palladium-gold, nickel-gold, the like, or a combination thereof and may be formed by a plating process.

The bonding between the dies 130 and the substrate 112 may be a solder bonding or a direct metal-to-metal (such as a copper-to-copper or tin-to-tin) bonding. In an embodiment, the dies 130 are bonded to the substrate 112 by a reflow process. During this reflow process, the connectors 120 are in contact with the bond pads 116 and the dies 130 to physically and electrically couple the dies 130 to the substrate 112.

An underfill material 118 may be injected or otherwise formed in the space between the dies 130 and the substrate 112. The underfill material 118 may, for example, be a liquid epoxy, deformable gel, silicon rubber, or the like, that is dispensed between the dies 130 and the substrate 112, and then cured to harden. This underfill material 118 is used, among other things, to reduce cracking in and to protect the connectors 120.

The passivation layer 110 may be formed on the second side of the substrate 112. The passivation layer 110 can be silicon nitride, silicon carbide, silicon oxide, low-k dielectrics such as carbon doped oxides, extremely low-k dielectrics such as porous carbon doped silicon dioxide, a polymer, such as an epoxy, polyimide, benzocyclobutene (BCB), polybenzoxazole (PBO), the like, or a combination thereof, although other relatively soft, often organic, dielectric materials can also be used, and deposited by CVD, PVD, ALD, a spin-on-dielectric process, the like, or a combination thereof. In some embodiments, the passivation layer 110 is a polymer such as polyimide.

The substrate 112 may have bond pads 108 and connectors 106 formed on the second side of the substrate 112. The bond pads 108 and connectors 106 allow for substrate 112 and the dies 130 to be electrically coupled to external devices such as chips, dies, substrates, or the like (see FIG. 5). In some embodiments, the bond pads 108 are embedded within the passivation layer 110. The bond pads 108 and connectors 106 may be formed of similar materials and by similar processes as the bond pads 116 and connectors 120, respectively, discussed above and the descriptions will not be repeated herein, although they need not be the same.

A carrier 102 may be mounted to the connectors 106 through an adhesive layer 104. The adhesive layer 104 may be disposed, for example laminated, on the carrier 102. The adhesive layer 104 may be formed of a glue, such as an ultra-violet glue, or may be a lamination layer formed of a foil. The carrier 102 may be any suitable substrate that provides (during intermediary operations of the fabrication process) mechanical support for the layers on top. The carrier 102 may be a wafer including glass, silicon (e.g., a silicon wafer), silicon oxide, metal plate, a ceramic material, or the like.

Figure 2A:
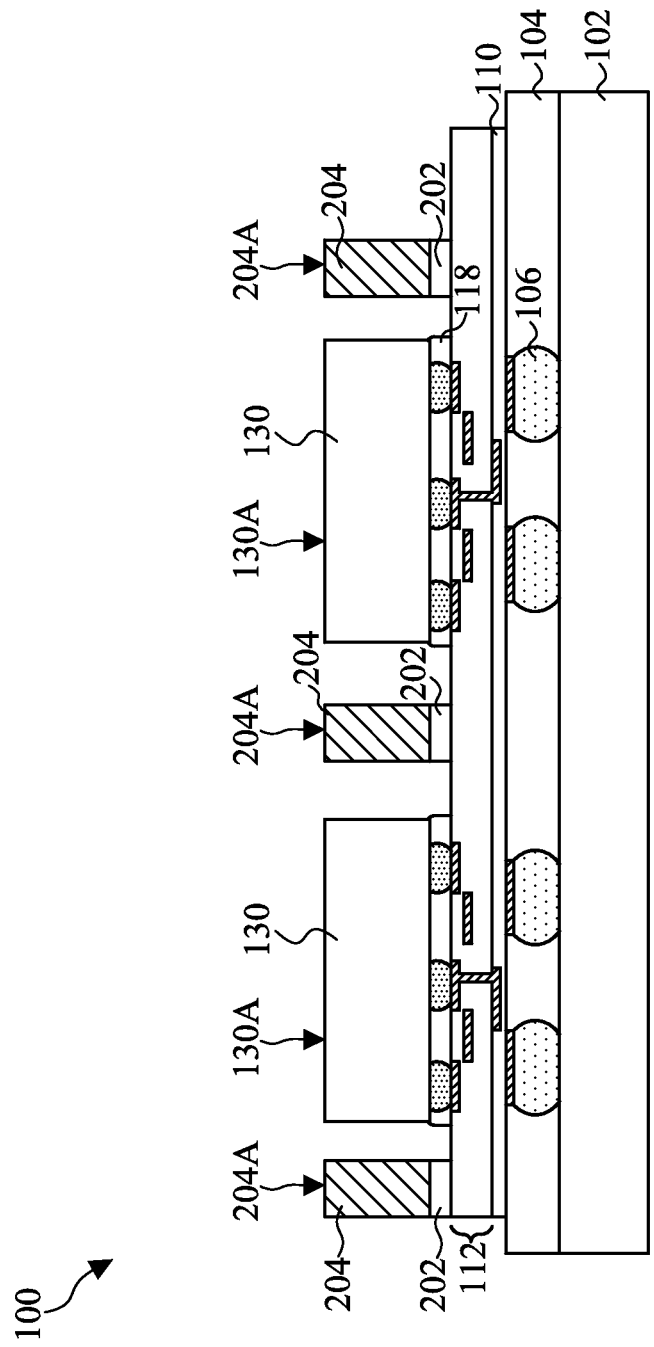

FIG. 2A illustrates the formation of support structures 204 (step 604) over the first side of the substrate 112. The support structures 204 may provide structural support during the singulation of the dies 130 and substrate 112 and may also act as a thermal component to dissipate heat from the substrate 112. The support structure 204 is adhered to the substrate 112 by an adhesive layer 202. The adhesive layer 202 may be an epoxy, resin, the like, or a combination thereof. The thickness of the adhesive layer 202 in a direction perpendicular to the first side surface may be between about 1 um and about 200 um. Although embodiments are not limited to a particular thickness, the thickness should not be so thick as to suppress thermal dissipation. The support structures 204 are then adhered to the first side of the substrate 112 by the adhesive layers 202. The placement of the support structures 204 may be by a pick-and-place tool. In some embodiments, the support structures 204 are placed adjacent and/or between the dies 130 where the substrate 112 will be singulated or sawed (see FIGS. 3A through 3D). These locations may be referred to as saw streets or scribe lines (see 302A and 302B in FIGS. 3A through 3D). The support structures may be made of a metal or a non-metal such as silicon, silicon germanium, copper, nickel plated copper, aluminum, the like or a combination thereof. In an embodiment, top surfaces 204A of the support structures 204 are substantially coplanar with top surfaces 130A of the dies 130. The support structures 204 may be free from active and passive devices. In an embodiment, the support structures 204 are rectangular or bar-shaped (see FIGS. 3A and 3C) as illustrated from a top view. In another embodiment, the support structures 204 are continuous rings around the dies 130 (see FIG. 3B).

Figure 2B:
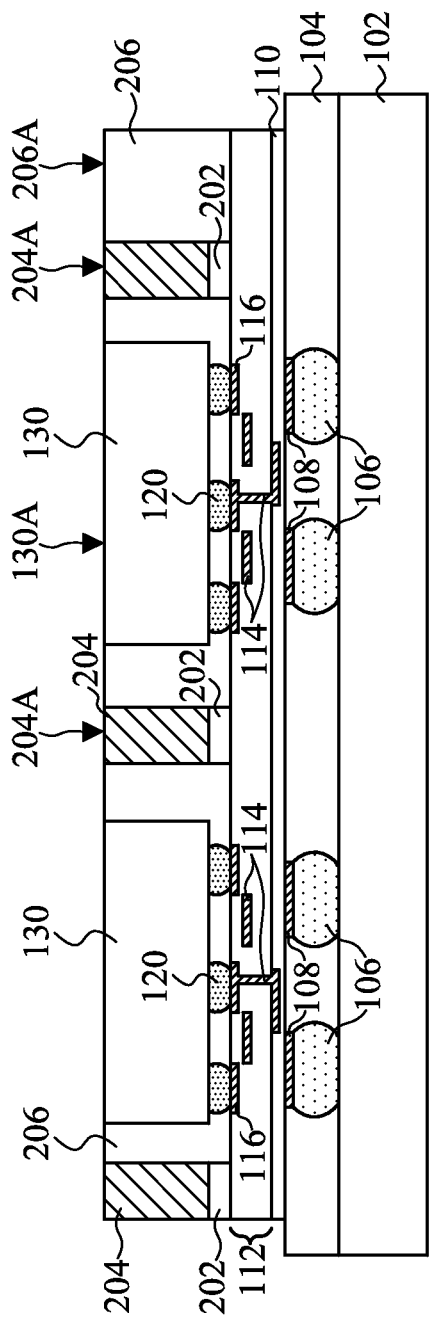

FIG. 2B illustrates an embodiment wherein a molding material is molded on and around the support structures 204, dies 130, connectors 120, and substrate 112. The molding material 206 fills the gaps between the support structures 204 and the dies 130, and may be in contact with substrate 112. Furthermore, the molding material 206 may be filled into the gaps between the dies 130 and the substrate 112 and may the underfill 118 may be omitted as the molding material 206 may protect the connectors 120. The molding material 206 may include a molding compound, a molding underfill, an epoxy, a resin, the like, or a combination thereof. The top surface of the molding material 206 may be higher than the top surfaces 130A of the dies 130 and the top surfaces 204A of the support structures 204. In an embodiment, a thinning step, which may be a grinding step, is performed to thin the molding material 206, until the top surface 206A of the molding material 206 is substantially coplanar with the top surfaces 130A of the dies 130 and the top surfaces 204A of the support structures 204. The molding material 206 may also undergo a pressure molding process by a pressure plate or mold (not shown) to shape the molding material 206 and force it into crevices surrounding the dies 130 and the support structures 204.

Figure 3A:
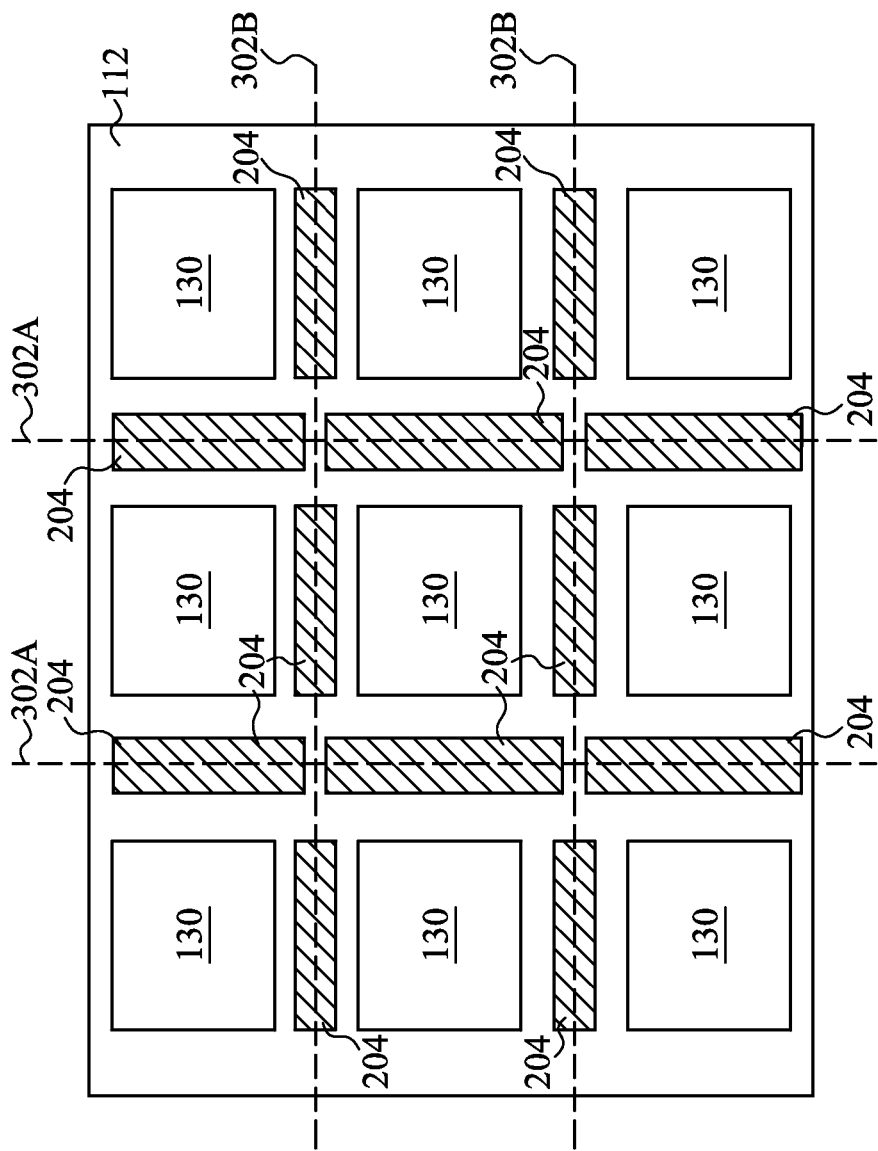

Although FIGS. 2A and 2B illustrate the support structures 204 adjacent dies 130 which are bonded to a substrate 112 which is mounted to a carrier 102, one of ordinary skill in the art would understand that the support structures 204 may be formed on any package component which may need support during singulation. For example, the support structures 204 may be formed adjacent chips which are wire bonded to a substrate or interposer. FIG. 3A illustrates a top view of the first side of the substrate 112 with the dies 130 and the rectangular support structures 204 according to an embodiment. The rectangular support structures 204 may be placed along saw streets 302A and 302B. In some embodiments, a saw street 302A or 302B has more than one support structure 204 placed along it with the support structures 204 physically separated from each other (see FIG. 3A). In other embodiments, a saw street 302A or 302B has a single continuous support structure 204 placed along the saw street. The longitudinal axis of the support structures 204 along saw streets 302A are substantially perpendicular to the longitudinal axis of the support structures 204 along saw streets 302B. The inner dies 130 may have support structures 204 adjacent each of the four sides of the inner dies 130. The outer dies 130 may have support structures 204 adjacent only two sides of the outer dies 130.

Figure 3B:
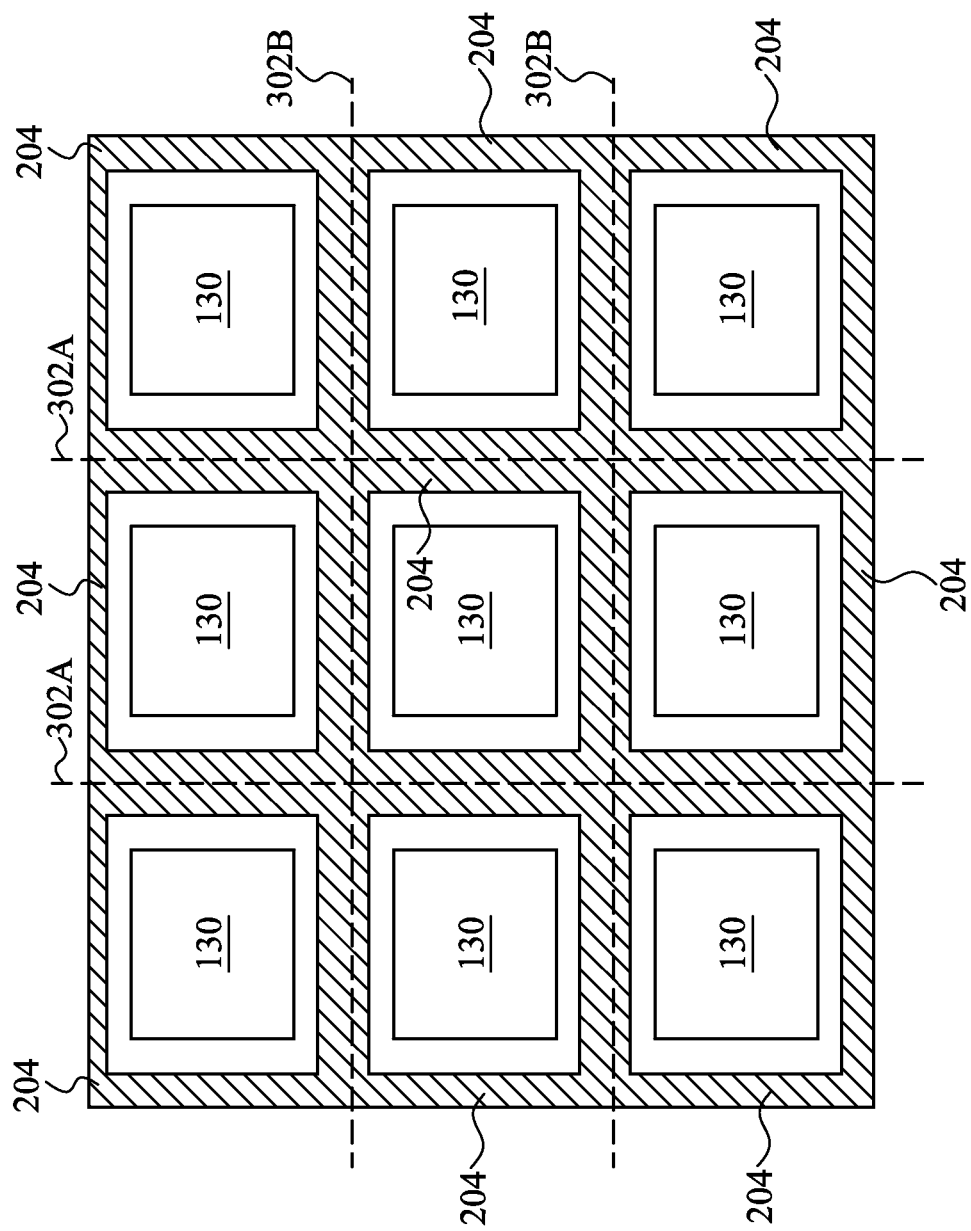

FIG. 3B illustrates a top view of the first side of the substrate 112 with the dies 130 and the ring support structures 204. The ring support structures 204 may encircle the dies 130 and may be placed along the saw streets 302A and 302B. In an embodiment, each of the ring support structures 204 encircles a single die 130. For example, in FIG. 3B, there may be nine discrete ring support structures 204 each encircling a single die 130. In another embodiment, each of the ring support structures 204 may encircle more than one die 130. For example, in FIG. 3B, the support structure 204 encircling each of the nine dies 130 may be a single, continuous support structure 204.

Figure 3C:
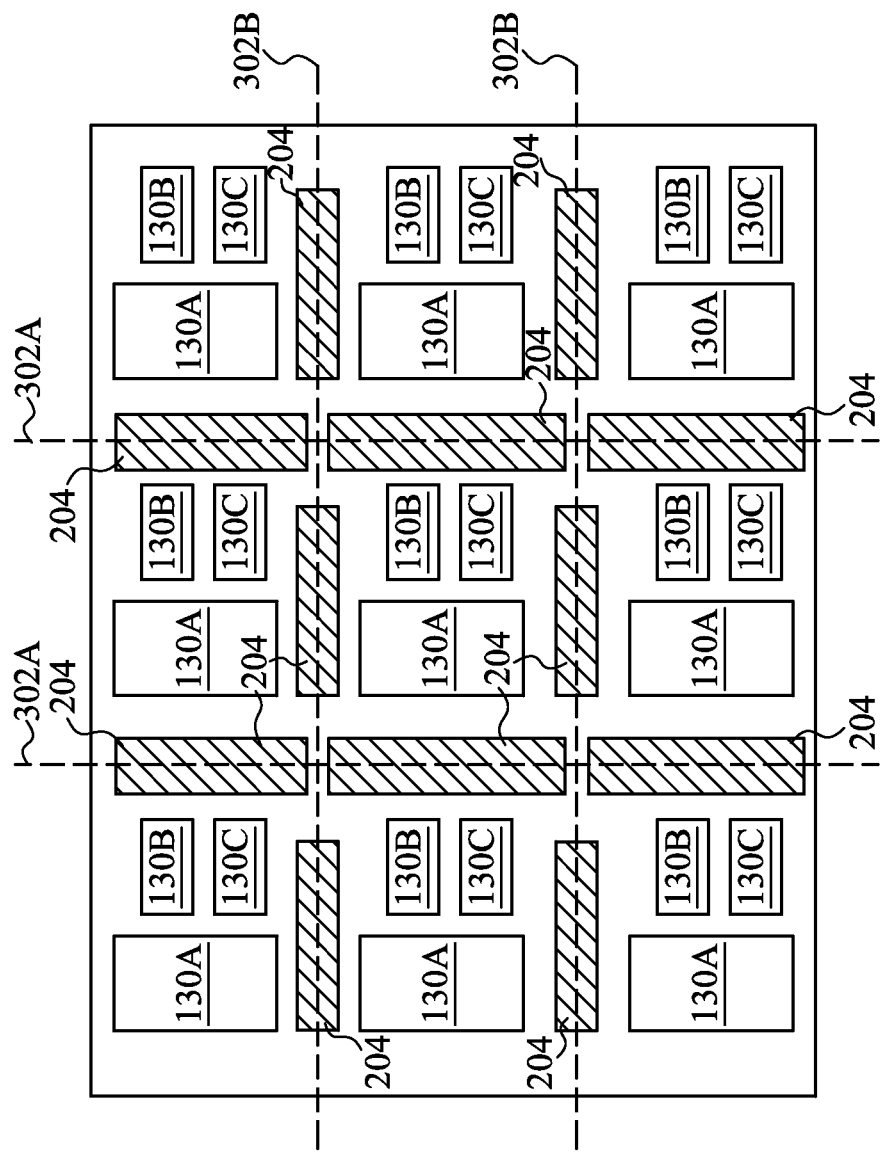

FIG. 3C illustrates a top view of the first side of the substrate 112 with multiple dies 130A, 130B, and 130C for each package structure and the rectangular support structures 204 according to an embodiment. In this embodiment, each singulated package structure comprises three dies with at least one of the dies comprising a logic die at least one other die comprising a memory die. In an embodiment, there is molding material 206 laterally between and surrounding the dies 130A, 130B, and 130C. Details regarding this embodiment that are similar to those for the previously described embodiment will not be repeated herein.

Figure 3D:
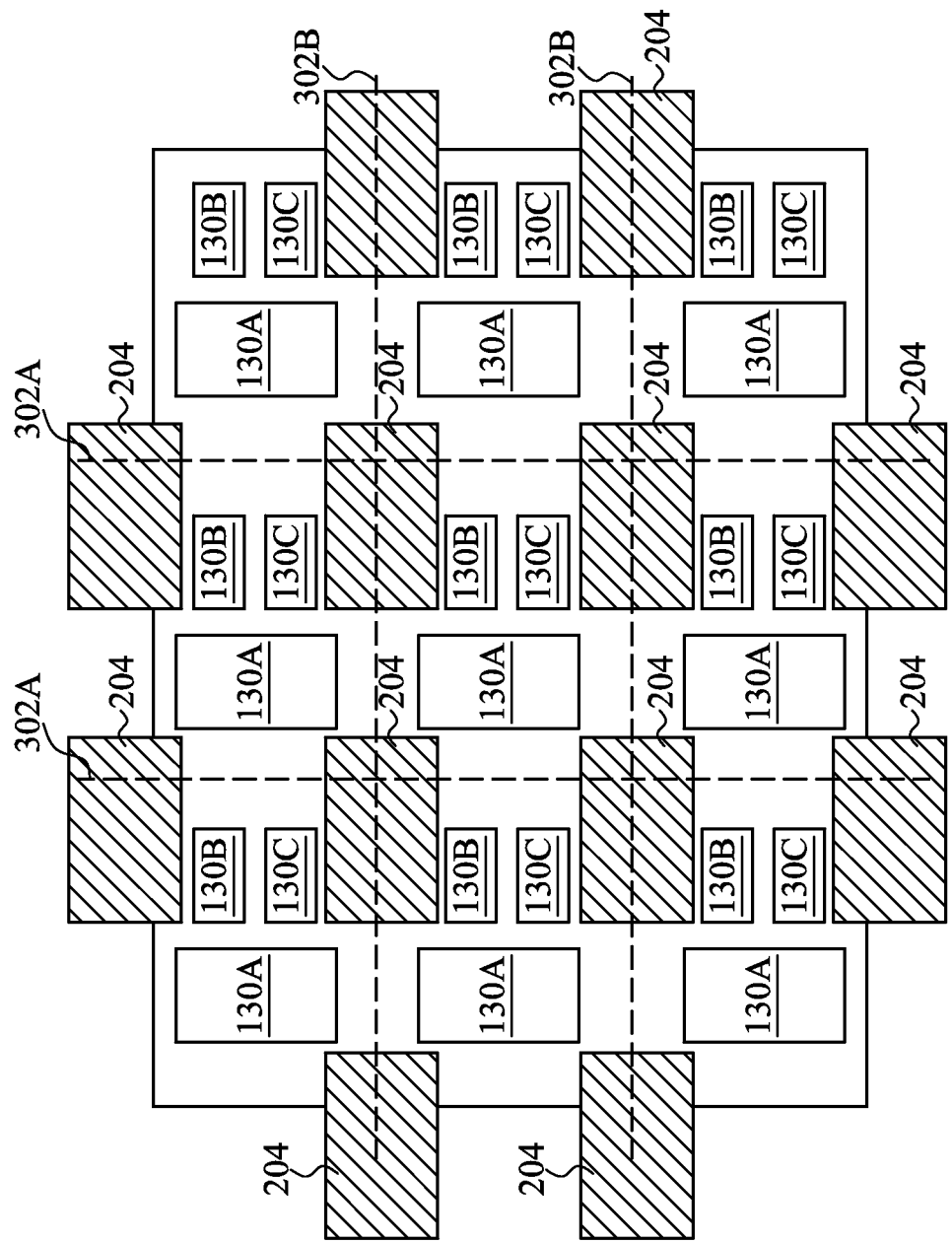

FIG. 3D illustrates a top view of the first side of the substrate 112 with multiple dies 130A, 130B, and 130C for each package structure and support structures 204 at the intersections of the saw streets 302A and 302B. In an embodiment, the support structures 204 are substantially square and are centered on the intersections of saw streets 302A and 302B. Details regarding this embodiment that are similar to those for the previously described embodiment will not be repeated herein.

The number of dies 130, the shape of the support structures 204, and the number of support structures 204 in FIGS. 3A through 3D are only for illustrative purposes and are not limiting. There could be any suitable number of dies 130 and support structures 204 and the support structures 204 may be any suitable shape.

FIG. 4 illustrates the singulation of the dies 130 and substrate 112 (step 606). As illustrated, the substrate 112 and dies 130 structure has been flipped over and the top surfaces 130A of the dies 130 and the top surfaces 204A of the support structures 204 are placed on a dicing tape 402. The carrier 102 has been demounted from the connectors 106 and the adhesive layer 104 has been removed. The substrate 112 may then be sawed to singulate individual packages. Cutting paths 404 created by the sawing process separate the substrate 112 into individual packages and also forms separate support structures 204' from support structures 204. The cutting paths 404 may substantially follow the saw streets 302A and 302B (see FIGS. 3A through 3D). After singulation, the support structures 204' have sidewalls that are substantially orthogonal to the top surface of the substrate 112. The sidewalls of the support structures 204' are substantially parallel to sidewalls of the die 130. In an embodiment, substantially an entire sidewall of the support structure 204', from the top surface of the substrate 112 to the top surface 204A of the support structure 204', is planar and orthogonal to the top surface of the substrate 112.

FIG. 5 illustrates bonding the substrate 112 to a substrate 502 (step 608) and mounting a lid over the substrate 112 and die 130 (step 610). The substrate 502 may be similar to the substrate 112 as described above, although the substrate 112 and the substrate 502 need not be the same. The substrate 502 is, in one alternative embodiment, based on an insulating core such as a fiberglass reinforced resin core. One example core material is fiberglass resin such as FR4. Alternatives for the core material include bismaleimide-triazine (BT) resin, or alternatively, other PC board materials or films. Build up films such as Ajinomoto build-up film (ABF) or other laminates may be used for substrate 502.

The substrate 502 may have contacts 508 which will be physically and electrically coupled to the connectors 106. In some embodiments, a pre-solder layer is formed over the contacts 508, and in some embodiments, the contacts include a bond pad or solder ball. The contacts 508 may be made of solder, tin, silver, tin, the like, or a combination thereof. In an embodiment, the substrate 502 is bonded to the substrate 112 by a reflow process. During this reflow process, the contacts 508 on the substrate 502 are in contact with the connectors 106 to physically and electrically couple the substrate 502 to the substrate 112.

The semiconductor device 100 further includes a lid 506, which may also be a heat spreader, attached to a top surface of the substrate 502 and the top surfaces 130A and 204A of the die 130 and the support structures 204' using a thermal interface material 504. The lid 506 in this embodiment has planar sides and a planar top surface, although in other embodiments, the lid 506 may be contoured to various contours of the semiconductor device 100, such as if the die 130 has a top surface below the top surfaces of the support structures 204'. The lid 506 in this embodiment is steel and, in other embodiments, can be other metals or non-metals such as be copper, stainless steel, the like, or a combination thereof. The thermal interface material 504 may be a thermally conductive and electrically insulative material, such as a polymer or an epoxy, like an epoxy mixed with a metal like silver or gold, a "thermal grease," a "white grease," the like, or a combination thereof. The thermal interface material 504 may be dispensed on the top surfaces 130A and 204A of the die 130 and the support structures 204'. The lid 506 may then be placed, using a pick-and-place tool, on the thermal interface material 504 to attach the lid 506 to the remainder of the semiconductor device 100. In this embodiment, the lid 506 does not extend laterally to the lateral edges of the substrate 502. In some embodiments, the lid 506 does extend laterally to the lateral edges of the substrate 502 such that the outer edges of the lid 506 and the lateral edges of the substrate 502 are coterminous.

The substrate 502 may have connectors 510 on a bottom surface, the surface opposite the top surface, to allow the substrate 502 to be bonded to other devices and/or substrates. These connectors 510 may be formed by similar processes and similar materials as connectors 106 and 120 discussed above and the descriptions will not be repeated herein.

FIGS. 7 through 11 are cross-sectional views of intermediate stages in the manufacturing of a semiconductor device according to another embodiment, and FIG. 6 is a process flow of the process shown in FIGS. 7 through 11. In this embodiment, a carrier is not used as the substrate 112 is thicker and provides the mechanical support during the processing. The metallization layers and vias 114 extend partially through the substrate 112 but do not extend to the backside of the substrate 112. Details regarding this embodiment that are similar to those for the previously described embodiment will not be repeated herein.

Figure 8:
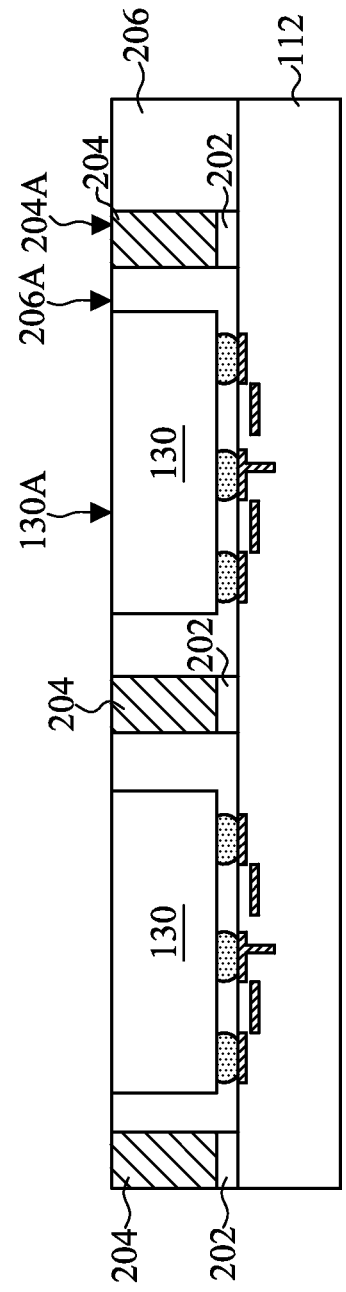

FIG. 8 illustrates the formation of support structures 204 (step 604) over the first side of the substrate 112. The support structures 204 may provide structural support during the singulation of the dies 130 and substrate 112 and may also act as a thermal component to dissipate heat from the substrate 112. The support structure 204 is adhered to the substrate 112 by an adhesive layer 202. A molding material 206 is molded on and around the support structures 204, dies 130, connectors 120, and substrate 112. The molding material 206 fills the gaps between the support structures 204 and the dies 130, and may be in contact with substrate 112. Furthermore, the molding material 206 may be filled into the gaps between the dies 130 and the substrate 112. In an embodiment, a thinning step, which may be a grinding step, is performed to thin the molding material 206, until the top surface 206A of the molding material 206 is substantially coplanar with the top surfaces 130A of the dies 130 and the top surfaces 204A of the support structures 204. The molding material 206 may also undergo a pressure molding process by a pressure plate or mold (not shown) to shape the molding material 206 and force it into crevices surrounding the dies 130 and the support structures 204.

Figure 9:
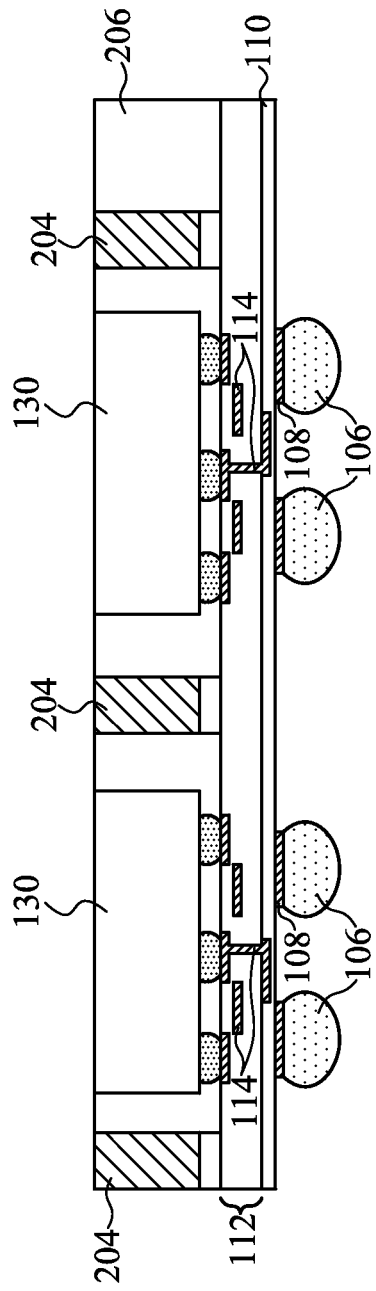

FIG. 9 illustrates the backside thinning of the substrate 112 and the formation of the connectors 106. In an embodiment, the substrate 112 may be thinned by a grinding process and/or an etching process. In some embodiments, the substrate 112 may be thinned such that the via 114 is exposed through the backside of the substrate 112. After the substrate 112 is thinned, the passivation layer 110, the bond pads 108, and the connectors 106 may be formed on the backside of the substrate 112.

Figure 10:
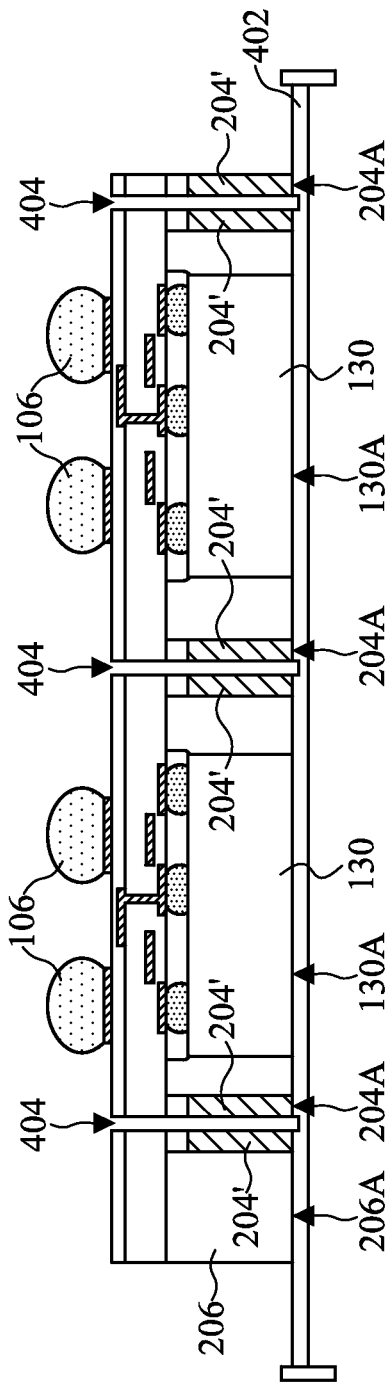

FIG. 10 illustrates the singulation of the dies 130 and substrate 112 (step 606). As illustrated, the substrate 112 and dies 130 structure has been flipped over and the top surfaces 130A of the dies 130, the top surfaces 204A of the support structures 204, and the top surface 206A of the molding compound 206 are placed on a dicing tape 402. This step is similar to the step described above in FIG. 4 and the details will not be repeated herein.

Figure 11:
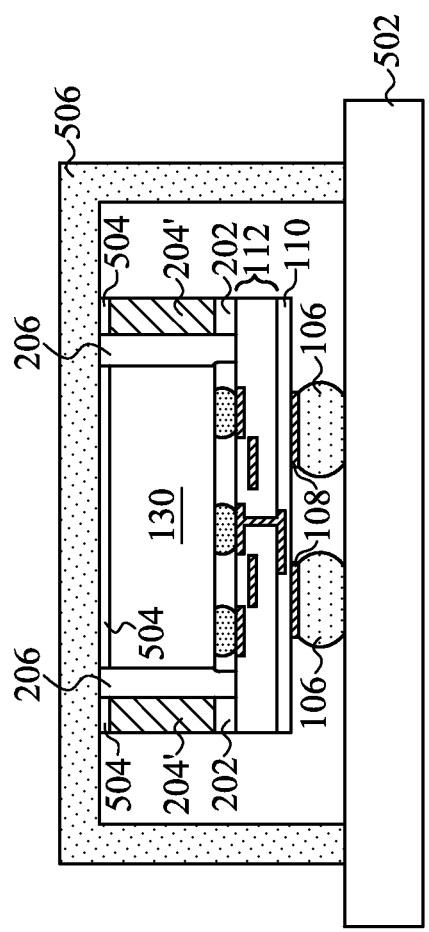

FIG. 11 illustrates bonding the substrate 112 to a substrate 502 (step 608) and mounting a lid over the substrate 112 and die 130 (step 610). This step is similar to the step described above in FIG. 5 and the details will not be repeated herein.

By having a support structure in the saw streets, the substrate is supported during sawing and does not chip away. Also, the support structure may act as a thermal component to dissipate and draw heat away from the substrate. In some embodiments, the support structure dissipates the heat to a lid or heat sink. Further, the support structure may help to prevent bleeding of underfill under the die to lateral edges of the substrate which may impact thermal performance.

An embodiment is a method of forming a semiconductor device, the method including bonding a die to a top surface of a first substrate, the die being electrically coupled to the first substrate, and forming a support structure on the top surface of the first substrate, the support structure being physically separated from the die with a top surface of the support structure being coplanar with a top surface of the die. The method further includes performing a sawing process on the first substrate, the sawing process sawing through the support structure.

Another embodiment is a method of forming a semiconductor device, the method including bonding a plurality of dies to a first side of a first substrate, and forming a plurality of support structures along a plurality of saw streets on the first side of the first substrate, the plurality of saw streets being adjacent the plurality of dies, each of the plurality of support structures being laterally separated from each of the plurality of dies. The method further includes singulating the plurality of dies by performing a sawing process along each of the plurality of saw streets, the sawing process sawing through the first substrate and the plurality of support structures.

A further embodiment is a semiconductor device including a first substrate over a second substrate, a first set of connectors coupling the first substrate to the second substrate, a die over the first substrate, and a second set of connectors coupling the die to the first substrate. The semiconductor device further includes a first support structure adhered to the first substrate, the first support structure having a top surface coplanar with a top surface of the die, the first support structure being adjacent the die, a thermal interface material layer on top surfaces of the die and the first support structure, and a lid mounted to the second substrate, a portion of the lid contacting the thermal interface material layer.

Although the present embodiments and their advantages have been described in detail, it should be understood that various changes, substitutions, and alterations can be made herein without departing from the spirit and scope of the disclosure as defined by the appended claims. Moreover, the scope of the present application is not intended to be limited to the particular embodiments of the process, machine, manufacture, composition of matter, means, methods, and operations described in the specification. As one of ordinary skill in the art will readily appreciate from the disclosure, processes, machines, manufacture, compositions of matter, means, methods, or operations, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or operations.

What is claimed is:

1. A semiconductor device comprising:
   a first substrate over a second substrate;
   a first set of connectors coupling the first substrate to the second substrate;
   a die over the first substrate;
   a second set of connectors coupling the die to the first substrate;
   a first support structure adhered to a top surface of the first substrate by an adhesive layer, the first support structure having a top surface coplanar with a top surface of the die, the first support structure being adjacent the die, the first support structure extending along a first side and a third side of the die;
   a second support structure adhered to the top surface of the first substrate, the second support structure being physically separated from the first support structure, the second support structure extending along a second side and a fourth side of the die, the second side of the die adjoining the first side of the die at a first corner of the die, the third side of the die adjoining the fourth side of the die at a second corner of the die opposite the first corner, the first support structure not extending along the second side and the fourth side of the die, the second support structure not extending along the first side and the third side of the die, wherein a line extends through the first support structure and the second support structure in a top-down view, the line being parallel to a longitudinal axis of the first support structure;
   a thermal interface material layer on top surfaces of the die and the first support structure; and
   a lid mounted to the second substrate, a portion of the lid contacting the thermal interface material layer.

2. The semiconductor device of claim 1 further comprising:
   a molding material laterally between the first support structure and the die.

3. The semiconductor device of claim 2, wherein the molding material has a top surface coplanar with the top surface of the die and the top surface of the first support structure.

4. The semiconductor device of claim 2, wherein the first support structure has a different material composition than the molding material.

5. The semiconductor device of claim 1, wherein the second support structure has a top surface coplanar with the top surface of the die.

6. The semiconductor device of claim 1, wherein the second support structure has a longitudinal axis extending in a direction perpendicular to the longitudinal axis of the first support structure.

7. The semiconductor device of claim 6 further comprising:
   a third support structure adhered to the first substrate along a third side of the die, the third support structure being physically separated from the first and second support structures, the third support structure having a longitudinal axis extending in a direction parallel to the longitudinal axis of the first support structure; and
   a fourth support structure adhered to the first substrate along a fourth side of the die, the fourth support structure being physically separated from the first, second, and third support structures, the fourth support structure having a longitudinal axis extending in a direction perpendicular to the longitudinal axis of the first support structure.

8. The semiconductor device of claim 1, wherein the first support structure comprises silicon, copper, nickel, or a combination thereof.

9. The semiconductor device of claim 1 further comprising:
   a non-solid material laterally between the first support structure and the die.

10. A device comprising:
    a die coupled to a first substrate with a first set of connectors;
    a first support structure and a second support structure adhered to the first substrate, the first support structure and the second support structure being adjacent a first side and a second side of the die, respectively, the second support structure being physically separated from the first support structure, the second support structure having a longitudinal axis extending in a direction perpendicular to a longitudinal axis of the first support structure, the first support structure having a first longer side and a first shorter side, the first longer side being in a direction parallel to the first side of the die, the second support structure having a second longer side and a second shorter side, the second longer side being in a direction parallel to the second side of the die; and
    a molding material at least laterally encapsulating the die and interposed between the die, the first support structure, and the second support structure.

11. The device of claim 10 further comprising:
    a second substrate coupled to a first substrate with a second set of connectors.

12. The device of claim 11 further comprising:
    a thermal interface material layer on top surfaces of the die, the first support structure, and the second support structure; and
    a lid mounted to the second substrate, a portion of the lid contacting the thermal interface material layer.

13. The device of claim 10, wherein the molding material has a top surface coplanar with top surfaces of the die, the first support structure, and the second support structure.

14. The device of claim 10, wherein the first support structure has a different material composition than the molding material.

15. The device of claim 10, wherein the first support structure and the second support structure have top surfaces coplanar with a top surface of the die.

16. The device of claim 10, wherein the first support structure comprises silicon, copper, nickel, or a combination thereof.

17. The device of claim 10 further comprising:
a third support structure adhered to the first substrate along a third side of the die, the first and second support structures being along first and second sides of the die, respectively, the third support structure being physically separated from the first and second support structures, the third support structure having a longitudinal axis extending in a direction parallel to a longitudinal axis of the first support structure; and
a fourth support structure adhered to the first substrate along a fourth side of the die, the fourth support structure being physically separated from the first, second, and third support structures, the fourth support structure having a longitudinal axis extending in a direction perpendicular to a longitudinal axis of the first support structure.

18. A package comprising:
a first die coupled to a first substrate with a first set of connectors;
a second die coupled to the first substrate with a second set of connectors, the second die being adjacent and physically separated from the first die;
a second substrate coupled to the first substrate with a third set of connectors;
a first support structure adhered to the first substrate, the first support structure being adjacent and physically separated from the first die and the second die, the first support structure extending along a first side and a third side of the first die;
a second support structure adhered to the first substrate, the second support structure being physically separated from the first support structure, the second support structure extending along a second side and a fourth side of the first die, the second side adjoining the first side at a first corner of the first die, the third side of the first die adjoining the fourth side of the first die at a second corner of the first die opposite the first corner, the first support structure not extending along the second side and the fourth side of the first die, the second support structure not extending along the first side and the third side of the first die, wherein a line extends through the first support structure and the second support structure in a top-down view, the line being parallel to a longitudinal axis of the first support structure;
a molding material at least laterally encapsulating the first die and the second die, the molding material being interposed between the first die and the first support structure;
a thermal interface material layer on top surfaces of the first die and the first support structure; and
a lid mounted to the second substrate, a portion of the lid contacting the thermal interface material layer.

19. The package of claim 18, wherein the first support structure is adhered to a top layer of the first substrate by an adhesive layer.

20. The package of claim 18, wherein the second die is disposed between the first die and the first support structure.

* * * * *